United States Patent
Tamura

(10) Patent No.: US 9,335,349 B2
(45) Date of Patent: May 10, 2016

(54) CURRENT SENSOR

(71) Applicant: ALPS GREEN DEVICES CO., LTD., Tokyo (JP)

(72) Inventor: Manabu Tamura, Miyagi-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 210 days.

(21) Appl. No.: 14/137,377

(22) Filed: Dec. 20, 2013

(65) Prior Publication Data

US 2014/0103908 A1   Apr. 17, 2014

Related U.S. Application Data

(63) Continuation of application No. PCT/JP2012/070818, filed on Aug. 16, 2012.

(30) Foreign Application Priority Data

Sep. 13, 2011   (JP) .................. 2011-199487

(51) Int. Cl.
*G01R 15/20* (2006.01)
*G01R 33/02* (2006.01)
*G01R 19/00* (2006.01)

(52) U.S. Cl.
CPC .......... *G01R 19/0092* (2013.01); *G01R 15/207* (2013.01); *G01R 19/00* (2013.01); *G01R 15/20* (2013.01); *G01R 33/02* (2013.01)

(58) Field of Classification Search
CPC ...... G01R 15/202; G01R 19/00; G01R 33/02; G01R 15/20

USPC .................. 324/244, 117 R, 117 H
See application file for complete search history.

(56) References Cited

U.S. PATENT DOCUMENTS

| | | | |
|---|---|---|---|
| 7,898,240 B2 | 3/2011 | Shibahara et al. | |
| 8,975,889 B2 * | 3/2015 | Ausserlechner et al. | . 324/117 H |
| 2009/0121704 A1 | 5/2009 | Shibahara | |

FOREIGN PATENT DOCUMENTS

| | | |
|---|---|---|
| JP | 2001-66327 | 3/2001 |
| JP | 2011-89931 | 5/2011 |

OTHER PUBLICATIONS

Search Report dated Sep. 11, 2012 from International Application No. PCT/JP2012/070818.

\* cited by examiner

*Primary Examiner* — Reena Aurora
(74) *Attorney, Agent, or Firm* — Beyer Law Group LLP

(57) ABSTRACT

A current sensor of the present invention includes a mounting unit including a disposition region in which a current path is disposed, a pair of magnetic detection elements disposed in the mounting unit so as to sandwich therebetween the disposition region, and an arithmetic circuit performing an arithmetic operation on the current value of the current path on the basis of the detection values of the pair of magnetic detection elements. The pair of magnetic detection elements is disposed on sides opposite to each other with respect to a virtual line passing through the gravity center of the current path in cross-sectional view of the current path, and individually has sensitivity axes parallel to a direction perpendicular to the direction of a current conducted through the current path and the direction of the virtual line.

5 Claims, 6 Drawing Sheets

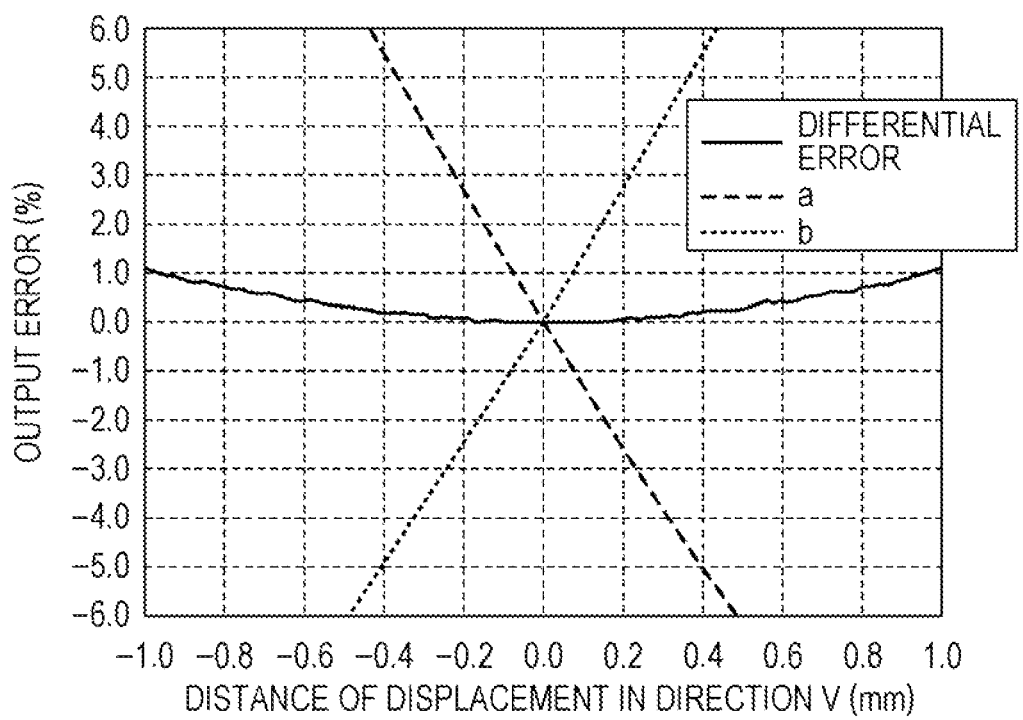
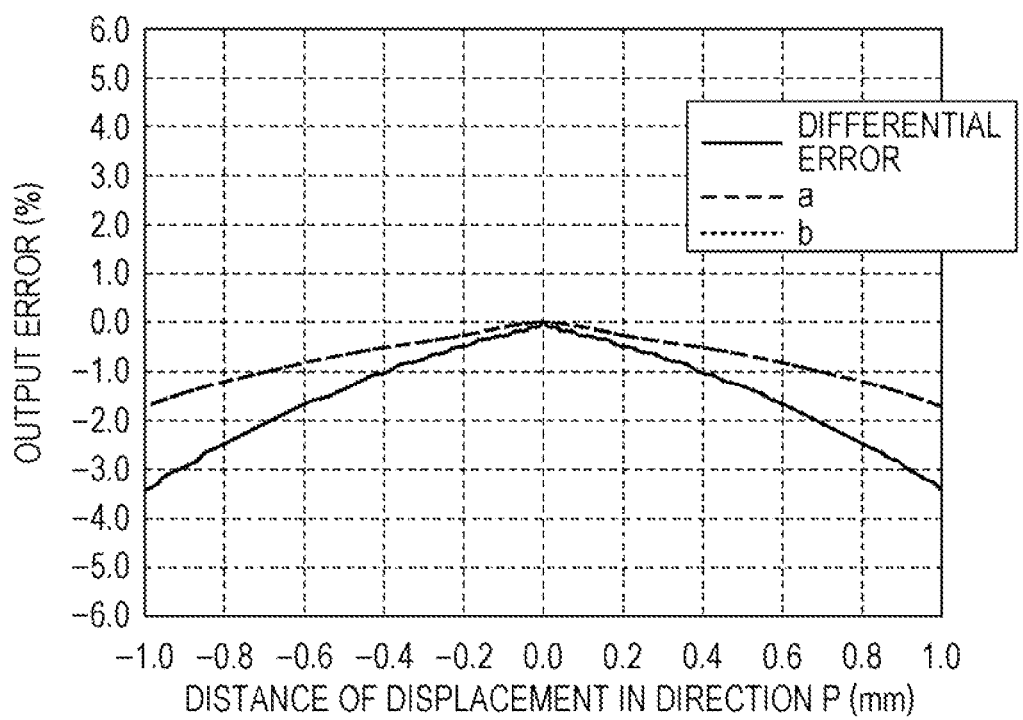

CURRENT SENSOR

CLAIM OF PRIORITY

This application is a Continuation of International Application No. PCT/JP2012/070818 filed on Aug. 16, 2012, which claims benefit of Japanese Patent Application No. 2011-199487 filed on Sep. 13, 2011. The entire contents of each application noted above are hereby incorporated by reference.

BACKGROUND OF THE INVENTION

1. Field of the Invention

The present invention relates to a current sensor for measuring the magnitude of a current. In particular, the present invention relates to a current sensor where a decrease in current measurement accuracy is suppressed that is due to the displacement of the disposition position of a current path.

2. Description of the Related Art

In a field such as a technology for driving motors in electric vehicles, hybrid cars, and the like, a relatively large current is handled. Therefore, for such use, a current sensor has been desired that is capable of measuring a large current in a non-contact manner. As such a current sensor, a type of current sensor has been put into practical use, the type of current sensor detecting the change of a magnetic field occurring from a current conducted through a current path, using a magnetic detection element.

As the current sensor utilizing a magnetic detection element, there has been known a current sensor where two magnetic detection elements are disposed in the vicinity of a current path and a current conducted through the corresponding current path is measured on the basis of the arithmetic operation result of the detection values of the corresponding two magnetic detection elements (see, for example, U.S. Patent Application Publication No. 2009/0121704). The corresponding current sensor includes a current path through which a current serving as a measurement target is conducted, a substrate in which a concave portion is formed, the corresponding current path being disposed in the concave portion, and two magnetic detection elements symmetrically disposed in the corresponding substrate with sandwiching therebetween the concave portion.

SUMMARY OF THE INVENTION

Incidentally, in the above-mentioned current sensor, a case is supposed in which the disposition position of the current path in the concave portion of the substrate is displaced owing to, for example, an installation error when the current path is installed in the concave portion of the substrate or the vibration of the current sensor installed in an electric vehicle or the like. However, in the above-mentioned current sensor, there has been a problem that when the disposition position of the current path is displaced in the disposition region of the current path, such as the concave portion of the substrate, the current measurement accuracy of the corresponding current path is significantly reduced in some cases.

In view of such a point, the present invention is made, and the present invention provides a current sensor capable of suppressing a decrease in current measurement accuracy even if the disposition position of a current path is displaced in the disposition region of the corresponding current path.

The present invention provides a current sensor including a mounting unit configured to include a disposition region in which a current path is disposed, a pair of magnetic detection elements configured to be disposed on the mounting unit so as to sandwich therebetween the disposition region, and an arithmetic circuit configured to be provided on the mounting unit and perform an arithmetic operation on a current value of the current path on the basis of detection values of the pair of magnetic detection elements, wherein the pair of magnetic detection elements is disposed on sides opposite to each other with respect to a virtual line passing through a gravity center of the current path in cross-sectional view of the current path, and individually has sensitivity axes parallel to a direction perpendicular to a direction of a current conducted through the current path and a direction of the virtual line.

According to this configuration, the pair of magnetic detection elements is disposed on sides opposite to each other with respect to the virtual line passing through the gravity center of the current path in cross-sectional view of the current path. Therefore, even if the disposition position of the current path is displaced in the disposition region of the current path, it may be possible to cause the pluses and minuses of the output errors of the pair of magnetic detection elements to be reversed. Therefore, by performing an arithmetic processing on the basis of the detection values of the pair of magnetic detection elements, it may be possible to cancel out the output errors associated with the displacement of the disposition position of the current path, and it may be possible to suppress a decrease in current measurement accuracy when the disposition position of the current path is displaced.

In the current sensor of preferred embodiments of the present invention, the pair of magnetic detection elements may also be disposed so that entire portions of the pair of magnetic detection elements are located on sides opposite to each other with respect to the virtual line.

In the current sensor of preferred embodiments of the present invention, the pair of magnetic detection elements may also be disposed so that distances from centers of the individual magnetic detection elements to the virtual line become equal to each other.

In the current sensor of preferred embodiments of the present invention, the disposition region may also extend in directions of the sensitivity axes and include a concave portion including an opening portion, and the current path may also have a flat-plate shape and be disposed in the concave portion in such a manner that the current path is inserted from the opening portion along a main surface of the current path.

In the current sensor of preferred embodiments of the present invention, the mounting unit may also include a pair of substrates disposed parallel to each other, the disposition region may also be a region between the pair of substrates, and the current path may also be a flat-plate shaped conductor and disposed in the disposition region so that a main surface of the current path and main surfaces of the pair of substrates become parallel to each other.

BRIEF DESCRIPTION OF THE DRAWINGS

FIGS. 2A and 2B are graphs illustrating a relationship between a displacement of a disposition position of a current path and an output error;

DESCRIPTION OF THE PREFERRED EMBODIMENTS

Figure 1A:
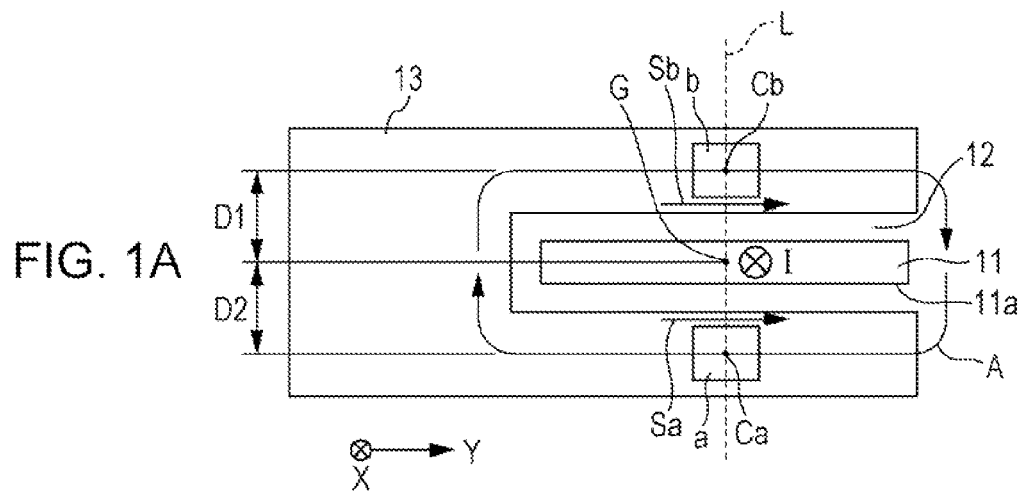
FIGS. 1A to 1C are diagrams for explaining a displacement of a disposition position of a current path.
Figure 1B:
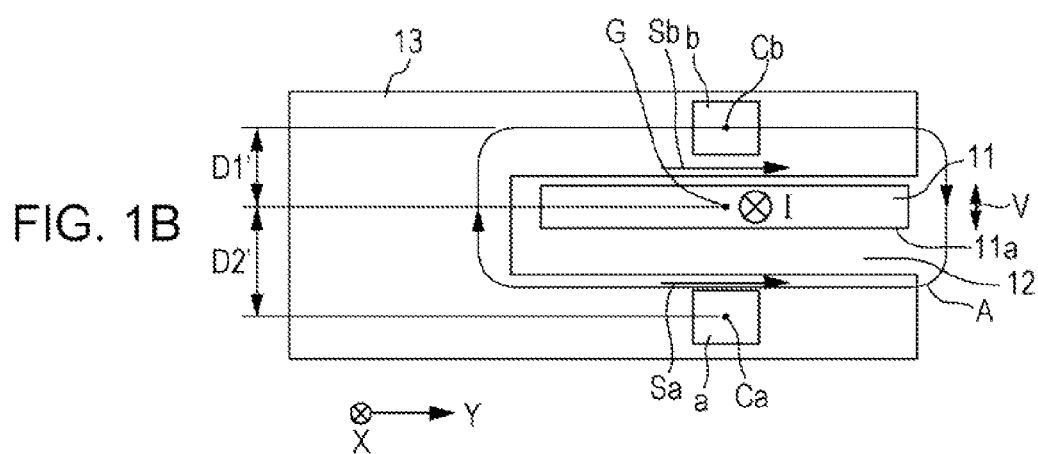
Figure 1C:
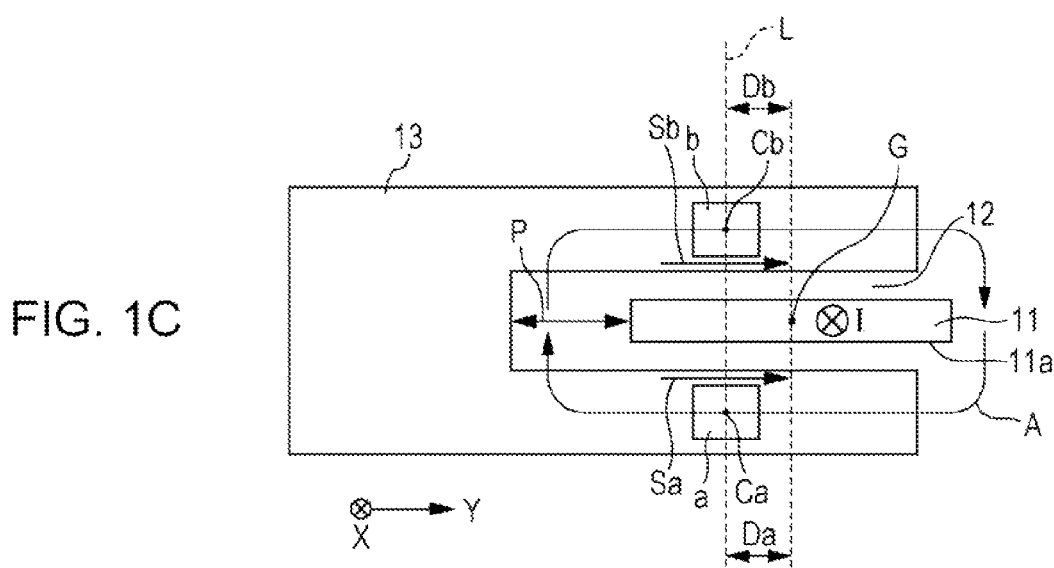

With reference to FIGS. 1A to 1C and FIGS. 2A and 2B, the output errors of a pair of magnetic detection elements will be considered that are associated with the displacement of the disposition position of a current path. FIGS. 1A to 1C are diagrams for explaining the displacement of the disposition position of the current path. FIGS. 2A and 2B are graphs illustrating a relationship between the displacement of the disposition position of the current path and the output error. The current sensor illustrated in FIGS. 1A to 1C includes a flat-plate shaped current path 11, a substrate 13 in which a concave shaped disposition region 12 is formed, the current path 11 being disposed in the concave shaped disposition region 12, and a pair of magnetic detection elements a and b symmetrically disposed with sandwiching therebetween the disposition region 12.

The substrate 13 is formed in a Y direction (width direction) in FIG. 1A, a concave portion having an opening portion is provided therein, and that concave portion serves as the disposition region 12. In such front view as FIG. 1A, this disposition region 12 has a rectangular shape. In this disposition region 12, the current path 11 is disposed in such a manner that the current path 11 is inserted from the opening portion along the main surface 11a of the current path. In FIGS. 1A to 1C, the pair of magnetic detection elements a and b has sensitivity axis directions Sa and Sb parallel to the main surface of the current path 11, and detects an induction magnetic field A from a current conducted through the current path 11.

In FIG. 1A, in the disposition region 12, the current path 11 is disposed at a desired position. This current path 11 is fixed in the disposition region 12 of the substrate 13. In addition, as a fixing method, an existing method may be used that fixes a member to the substrate. At this time, the current path 11 is disposed so that distances from the centers Ca and Cb of the pair of magnetic detection elements a and b become equal to each other, the pair of magnetic detection elements a and b being symmetrically disposed with sandwiching therebetween the disposition region 12. Therefore, distances D1 and D2 between the gravity center G of the current path 11 in cross-sectional view and the centers Ca and Cb of the magnetic detection elements a and b become equal to each other, respectively. In addition, the current path 11 is disposed so that the centers Ca and Cb of the magnetic detection elements a and b are located on a virtual line L passing through the gravity center G of the current path 11 in cross-sectional view of the current path 11. Here, the direction of the virtual line L is parallel to a direction individually perpendicular to a direction (an X direction in FIG. 1A) in which the current is conducted through the current path 11 and the sensitivity axis directions Sa and Sb (the Y direction in FIG. 1A) of the pair of magnetic detection elements a and b.

In FIG. 1B, in the disposition region 12, the current path 11 is displaced in a direction V perpendicular to the sensitivity axis directions Sa and Sb of the magnetic detection elements a and b. Specifically, in FIG. 1B, in the direction V, the current path 11 is displaced from the desired position illustrated in FIG. 1A to the magnetic detection element b side. Therefore, a distance D1' between the gravity center G of the current path 11 in cross-sectional view and the center Cb of the magnetic detection element b becomes smaller than the distance D1 in FIG. 1A, the detection value of the induction magnetic field A in the magnetic detection element b becomes larger than a case illustrated in FIG. 1A, and the output error of a positive value turns out to occur. On the other hand, a distance D2' between the gravity center G and the center Ca of the magnetic detection element a becomes larger than the distance D2 illustrated in FIG. 1A, the detection value of the induction magnetic field A in the magnetic detection element a becomes smaller than the case illustrated in FIG. 1A, and the output error of a negative value turns out to occur.

With reference to FIG. 2A, an output error will be fully described that occurs when the disposition position of the current path 11 is displaced in the direction V perpendicular to the sensitivity axis directions Sa and Sb of the magnetic detection elements a and b. A horizontal axis in FIG. 2A indicates a distance by which the disposition position of the current path 11 is displaced from the desired position (in other words, the position illustrated in FIG. 1A) in the direction V. For example, in FIG. 2A, a displacement to the magnetic detection element b side is expressed by a positive value, and a displacement to the magnetic detection element a side is expressed by a negative value. As illustrated in FIG. 2A, when the disposition position of the current path 11 is displaced in the direction V perpendicular to the sensitivity axis directions Sa and Sb of the magnetic detection elements a and b, the pluses and minuses of the output errors of the pair of magnetic detection elements a and b are reversed. For example, in FIG. 1B, when the disposition position of the current path 11 is displaced from the desired position in the direction V by +0.2 mm, the output error of the magnetic detection element a becomes about −2.5%, and the output error of the magnetic detection element b becomes about +2.6%. In such a case, since, by taking a difference between the outputs of the magnetic detection elements a and b, it may be possible to cancel out each other's output errors, it may be possible to suppress the differential error of the magnetic detection elements a and b to about +0.1%.

On the other hand, in FIG. 1C, in the disposition region 12, the current path 11 is displaced in a direction P parallel to the sensitivity axis directions Sa and Sb of the magnetic detection elements a and b. Specifically, in FIG. 1C, the current path 11 is displaced from the desired position illustrated in FIG. 1A toward the outside of the disposition region 12. Therefore, distances Da and Db between the above-mentioned virtual line L and the centers Ca and Cb of the magnetic detection elements a and b, respectively, become larger than the case illustrated in FIG. 1A ("0" in FIG. 1A). As a result, both of the detection values of the induction magnetic field A in the magnetic detection elements a and b become smaller than the case illustrated in FIG. 1A, and in both of the detection values, negative output errors turn out to occur.

With reference to FIG. 2B, an output error will be fully described that occurs when the disposition position of the current path 11 is displaced in the direction P parallel to the sensitivity axis directions Sa and Sb of the magnetic detection elements a and b. A horizontal axis in FIG. 2B indicates a distance by which the disposition position of the current path 11 is displaced from the desired position (in other words, the position illustrated in FIG. 1A) in the direction P. For example, in FIG. 2B, a displacement toward the outside of the disposition region 12 is expressed by a positive value, and a displacement toward the inside of the disposition region 12 is expressed by a negative value. As illustrated in FIG. 2B, when the disposition position of the current path 11 is displaced in the direction P parallel to the sensitivity axis directions Sa and Sb of the magnetic detection elements a and b, the pluses and minuses of the output errors of the pair of magnetic detection elements a and b become equal. In addition, in FIG. 2B, lines overlap with each other, the lines indicating the output errors of the pair of magnetic detection elements a and b. For example, when, in FIG. 1C, it is assumed that the disposition position of the current path 11 is displaced from the desired position in the direction P by +0.4 mm, both of the output errors of the magnetic detection elements a and b become about −0.5%. In such a case, when a difference between the magnetic detection elements a and b is taken, the differential error of the magnetic detection elements a and b is doubled to about −1.0% as illustrated in FIG. 2B, and it may be difficult to cancel out the output errors of the magnetic detection elements a and b. Therefore, when the disposition position of the current path 11 is displaced in the direction P parallel to the sensitivity axis directions Sa and Sb of the magnetic detection elements a and b, it is also desirable that, by causing the pluses and minuses of the output errors of the pair of magnetic detection elements a and b to be reversed, the output errors of the magnetic detection elements a and b are cancelled out.

The present inventor focused attention on it that, so as to reduce an output error associated with the displacement of the disposition position of a current path by performing differential processing on the outputs of a pair of magnetic detection elements in a current sensor performing an arithmetic operation on a current value on the basis of the outputs of a pair of magnetic detection elements such as GMR sensors, the pluses and minuses of the output errors of the pair of magnetic detection elements are desired to be reversed when the disposition position of the current path has been displaced.

On the basis of such a finding, the present inventor conceived an idea that, by disposing a pair of magnetic detection elements at positions where the pluses and minuses of the output errors of the pair of magnetic detection elements are reversed when the disposition position of a current path has been displaced in any direction perpendicular or parallel to the sensitivity axis directions of the pair of magnetic detection elements, the above-mentioned output errors are cancelled out by performing differential processing on the outputs of the pair of magnetic detection elements, and a decrease in current measurement accuracy associated with the displacement of the disposition position of the current path is suppressed.

In other words, the outline of the present invention is that, in a current sensor performing an arithmetic operation on a current value on the basis of the outputs of a pair of magnetic detection elements, a configuration is adopted where the pair of magnetic detection elements is disposed with sandwiching therebetween a disposition region, in a mounting unit in which the disposition region is formed, a current path being disposed in the disposition region, the pair of magnetic detection elements is disposed on sides opposite to each other with respect to a virtual line passing through the gravity center of the corresponding current path in cross-sectional view of the corresponding current path, and furthermore the pair of magnetic detection elements individually has sensitivity axes parallel to a direction perpendicular to the direction of a current conducted through the corresponding current path and the direction of the corresponding virtual line, and hence, even if the disposition position of the corresponding current path has been displaced in any direction perpendicular or parallel to the sensitivity axis directions of the pair of magnetic detection elements, a decrease in current measurement accuracy is suppressed by causing the pluses and minuses of the output errors of the pair of magnetic detection elements to be reversed. Hereinafter, embodiments of the present invention will be described in detail with reference to drawings.

Embodiment

Figure 3A:
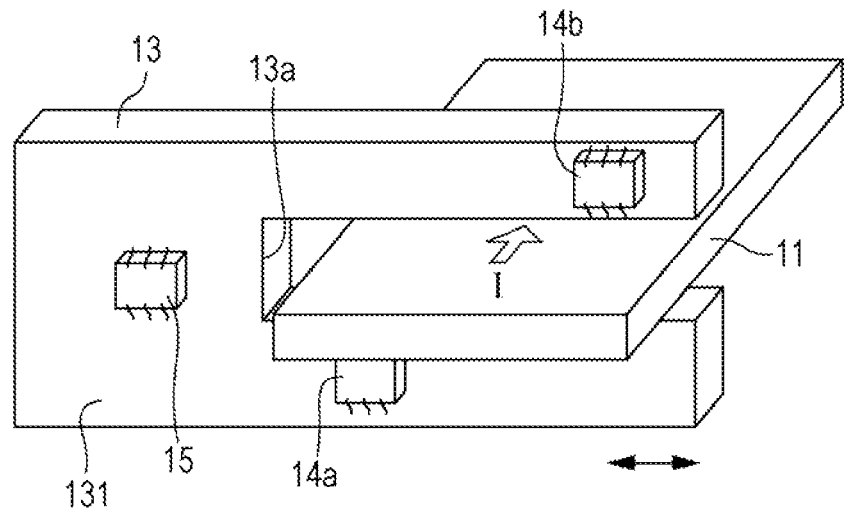
FIGS. 3A and 3B are pattern diagrams illustrating a current sensor according to an embodiment.
Figure 3B:
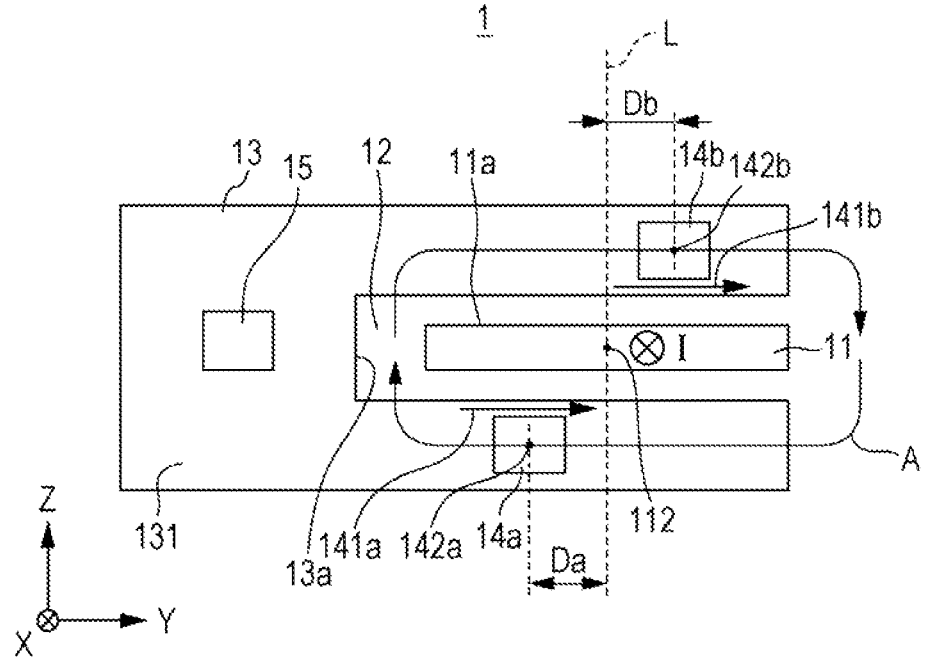

FIGS. 3A and 3B are pattern diagrams illustrating a current sensor 1 according to an embodiment. FIG. 3A is a perspective view schematically illustrating the configuration of the current sensor 1, and FIG. 3B is a plan view when the current sensor 1 is viewed from the near side of the plane of paper in FIG. 3A.

As illustrated in FIG. 3A, the current sensor 1 includes a current path 11 through which a current I to be measured is conducted, a substrate 13 (a mounting unit) in which the disposition region 12 of the current path 11 is formed, and two magnetic detection elements 14a and 14b disposed in the substrate 13. In addition, as described later, the current sensor 1 includes an arithmetic device 15 that is mounted on the substrate 13 and performs an arithmetic operation on the outputs of the two magnetic detection elements 14a and 14b. In the example illustrated in FIGS. 3A and 3B, a case will be described where the current path 11 has a flat-plate shape (a cross-sectional rectangle) and the substrate 13 includes a concave portion (a disposition region) into which this current path 11 is able to be inserted.

The substrate 13 is formed in a horizontal direction in FIG. 3A (a Y direction in FIG. 3B: a direction corresponding to the sensitivity axis directions 141a and 141b of after-mentioned magnetic detection elements 14a and 14b), a concave portion 13a having an opening portion is provided therein, and that concave portion 13a serves as the disposition region 12. This disposition region 12 has a rectangular shape in such front view as FIG. 3B. In this disposition region 12, the flat-plate shaped current path 11 is disposed in such a manner that the current path 11 is inserted from the opening portion along the main surface 11a of the current path. Accordingly, the substrate 13 includes a main surface 131 perpendicular to the direction of the current I to be measured conducted through the current path 11, and the disposition region 12 in which the current path 11 is disposed, in this main surface 131.

The current path 11 extends in a predetermined direction (a direction headed from the near side of the plane of paper to the depth in FIG. 3A), and is disposed so as to be sandwiched by the substrate 13 in the disposition region 12. While, in FIGS. 3A and 3B, the current path 11 has a flat-plate shape, the current path 11 may also adopt any form if the configuration thereof is capable of conducting therethrough the current I to be measured. For example, as the current path 11, a thin-film shaped conductive member (conductive pattern), a cross-section circular conductive member, or the like may be adopted. In addition, in FIG. 3A, an arrow assigned to the current path 11 indicates the direction of the current I to be measured conducted through the current path 11.

In the configuration in FIGS. 3A and 3B, the concave portion 13a serving as the disposition region 12 provided in the substrate 13 is provided in a width direction (the Y direction), in other words, provided so as to extend in the width direction (the Y direction) from one lateral portion (a right-sided lateral portion in FIGS. 3A and 3B), and the flat-plate shaped current path 11 is inserted into that concave portion 13a so that the main surface 11a is placed in the width direction (the Y direction). In FIG. 3B, while a clearance between the current path 11 and the substrate 13 in the up-and-down direction of the plane of paper is made wide, actually this clearance is significantly small, the current path 11 is engaged with the concave portion 13a of the substrate 13, and the current path 11 is fixed to the substrate 13. Accordingly, in this configuration, as understood from FIG. 3B, the opening portion exists in the concave portion 13a. Therefore, as for the current path 11, a movable region in the horizontal direction of the plane of paper is wider than a movable region in the up-and-down direction of the plane of paper. This configuration is a configuration where the position displacement of the current path 11 easily occurs in the horizontal direction of the plane of paper, compared with in the up-and-down direction of the plane of paper. In other words, this configuration turns out to have a direction in which it is easy for the position displacement of the current path 11 to relatively occur with respect to the substrate (mounting unit) 13 mounting therein the magnetic detection elements 14a and 14b.

The magnetic detection elements 14a and 14b are provided on the main surface of the substrate 13. Each of the magnetic detection elements 14a and 14b has a sensitivity axis parallel to a direction individually perpendicular to the direction of the current conducted through the current path and the direction of the virtual line L. The magnetic detection elements 14a and 14b are not specifically limited if being capable of performing magnetic detection. For example, as the magnetic detection elements 14a and 14b, magnetoresistance effect elements such as giant magneto resistance (GMR) elements or tunnel magneto resistance (TMR) elements, Hall elements, or the like may be used. In addition, when the Hall elements are used as the magnetic detection elements 14a and 14b, the normal directions of the magnetically sensitive surfaces of the corresponding Hall elements correspond to the sensitivity axes. Hereinafter, a case will be described where the GMR elements are used as the magnetic detection elements 14a and 14b.

As illustrated in FIG. 3B, in order to obtain outputs whose phases are approximately opposite to each other owing to the induction magnetic field A from the current I to be measured conducted through the current path 11, the magnetic detection elements 14a and 14b are disposed on the main surface 131 of the substrate 13 so as to sandwich therebetween the disposition region 12. In addition, the magnetic detection elements 14a and 14b are disposed on sides opposite to each other with respect to the virtual line L passing through the gravity center 112 of the current path 11 in cross-sectional view of the current path 11. Here, the direction of the virtual line L is parallel to a direction individually perpendicular to the direction (an X direction in FIG. 3B) in which a current is conducted through the current path 11 and the sensitivity axis directions 141a and 141b (the Y direction in FIG. 3B) of the pair of magnetic detection elements 14a and 14b. The pair of magnetic detection elements 14a and 14b is disposed on sides opposite to each other with respect to such a virtual line L, and hence, even if the disposition position of the current path 11 is displaced in the sensitivity axis directions 141a and 141b (the Y direction in FIG. 3B) of the pair of magnetic detection elements 14a and 14b, it may be possible to cause the pluses and minuses of the output errors of the pair of magnetic detection elements 14a and 14b to be reversed. In addition, the direction of the virtual line L is also parallel to a direction perpendicular to a direction (the Y direction in FIG. 3B) in which the main surface 11a of the flat-plate shaped current path 11 is placed.

In addition, as illustrated in FIG. 3B, the magnetic detection elements 14a and 14b may also be disposed so that the entire portions thereof deviate from the virtual line L (in FIG. 3B, the right end portion of the magnetic detection element 14a is located on the left side of the virtual line L, and the left end portion of the magnetic detection element 14b is located on the right side of the virtual line L), and as described later, the magnetic detection elements 14a and 14b may also be disposed so that a portion thereof overlaps with the virtual line L. In addition, the magnetic detection elements 14a and 14b may also be disposed so that a distance Da between a center 142a and the virtual line L and a distance Db between a center 142b and the virtual line L become equal to each other. In addition, the distance Da and the distance Db may not be identical to each other.

In addition, in FIG. 3B, the sensitivity axis direction 141b of the magnetic detection element 14b is headed in the direction of the induction magnetic field A, and the sensitivity axis direction 141a of the magnetic detection element 14a is headed in a direction opposite to the direction of the induction magnetic field A. As described above, the magnetic detection elements 14a and 14b are disposed so that the distances Da and Db between the centers 142a and 142b thereof and the virtual line L become approximately equal. Therefore, the influence of the induction magnetic field A emerges as the output signals of the magnetic detection elements 14a and 14b, whose phases are approximately opposite to each other.

Figure 4:
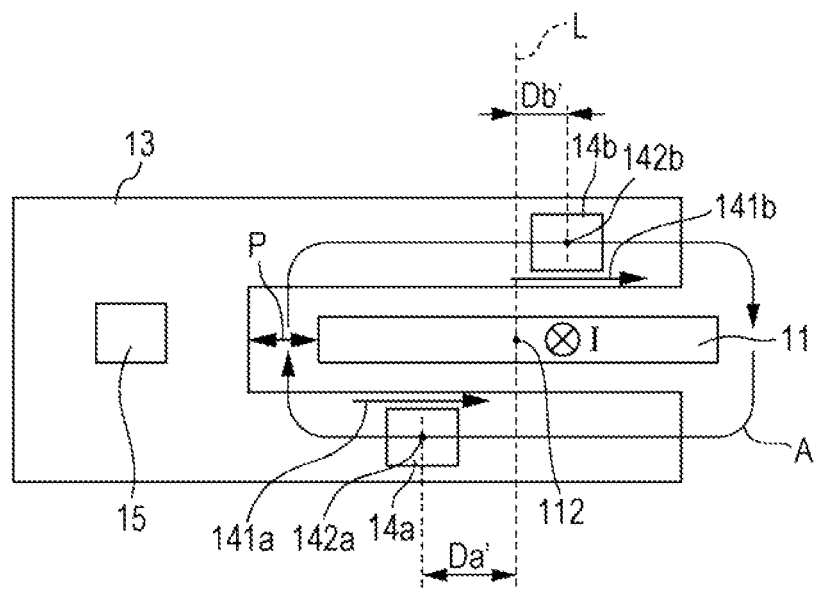
FIG. 4 is a diagram for explaining a displacement of a disposition position of a current path in a current sensor according to an embodiment.

Here, with reference to FIG. 4, a case will be considered where the disposition position of the current path 11 is displaced in the direction P parallel to the sensitivity axis directions 141a and 141b. FIG. 4 is a diagram illustrating a situation that the disposition position of the current path 11 is displaced in the direction P (in particular, to the magnetic detection element 14b side).

As illustrated in FIG. 4, when the disposition position of the current path 11 is displaced, a distance Da' between the center 142a of the magnetic detection element 14a and the virtual line L becomes larger than the distance Da illustrated in FIG. 3B. On the other hand, a distance Db' between the center 142b of the magnetic detection element 14b and the virtual line L becomes smaller than the distance Db illustrated in FIG. 3B. In such a case, while the detection value of the induction magnetic field A decreases in the magnetic detection element 14a compared with the case illustrated in FIG. 3B, the detection value of the induction magnetic field A increases in the magnetic detection element 14b. In other words, the output error of the magnetic detection element 14a becomes a negative value, the output error of the magnetic detection element 14b becomes a positive value, and the pluses and minuses of the output errors are reversed with respect to each other. Therefore, by performing differential processing on the detection values of the magnetic detection elements 14a and 14b, it may be possible to cancel out each other's output errors, and it may be possible to suppress a decrease in current measurement accuracy due to the displacement of the disposition position of the current path 11 in the direction P (in particular, to the magnetic detection element 14b side).

In addition, while not illustrated, when the disposition position of the current path 11 is displaced to the magnetic detection element 14a side in the direction P contrary to FIG. 4, a distance between the center 142a of the magnetic detection element 14a and the virtual line L becomes smaller than the distance Da illustrated in FIG. 3B, and a distance between the center 142b of the magnetic detection element 14b and the virtual line L becomes larger than the distance Db illustrated in FIG. 3B. In such as case, while the detection value of the induction magnetic field A increases in the magnetic detection element 14a compared with the case illustrated in FIG. 3B, the detection value of the induction magnetic field A decreases in the magnetic detection element 14b. In other words, the output error of the magnetic detection element 14a becomes a positive value, the output error of the magnetic detection element 14b becomes a negative value, and the pluses and minuses of the output errors are reversed with respect to each other. Therefore, by performing differential processing on the outputs of the magnetic detection elements 14a and 14b, it may be possible to cancel out each other's output errors, and it may be possible to suppress a decrease in current measurement accuracy due to the displacement of the disposition position of the current path 11 in the direction P (in particular, to the magnetic detection element 14a side).

As described above, the magnetic detection elements 14a and 14b are disposed on sides opposite to each other with respect to the virtual line L passing through the gravity center G of the current path 11 in cross-sectional view of the current path 11. Therefore, when the disposition position of the current path 11 in the disposition region 12 is displaced in the direction P (the Y direction in FIG. 3B) parallel to the sensitivity axis directions 141a and 141b, the pluses and minuses of the output errors of the magnetic detection elements 14a and 14b are also reversed. In other words, according to the above-mentioned dispositions of the magnetic detection elements 14a and 14b, even if the disposition position of the current path 11 is displaced in the direction P parallel to the sensitivity axis directions 141a and 141b, the pluses and minuses of the output errors of the magnetic detection elements 14a and 14b do not become equal as described in FIG. 2B. In addition, since the magnetic detection elements 14a and 14b are disposed so as to sandwich therebetween the disposition region 12 in the substrate 13, when the disposition position of the current path 11 is displaced in the direction V (a Z direction in FIG. 3B) perpendicular to the sensitivity axis directions 141a and 141b, the pluses and minuses of the output errors of the magnetic detection elements 14a and 14b are also reversed as described in FIG. 2A. Accordingly, according to the above-mentioned dispositions of the magnetic detection elements 14a and 14b, when the disposition position of the current path 11 is displaced in any direction parallel or perpendicular to the sensitivity axis directions 141a and 141b, it may also be possible to cancel out each other's output errors by performing arithmetic processing on the outputs of the magnetic detection elements 14a and 14b, and it may also be possible to suppress a decrease in the current measurement accuracy of the current path 11.

Figure 5:
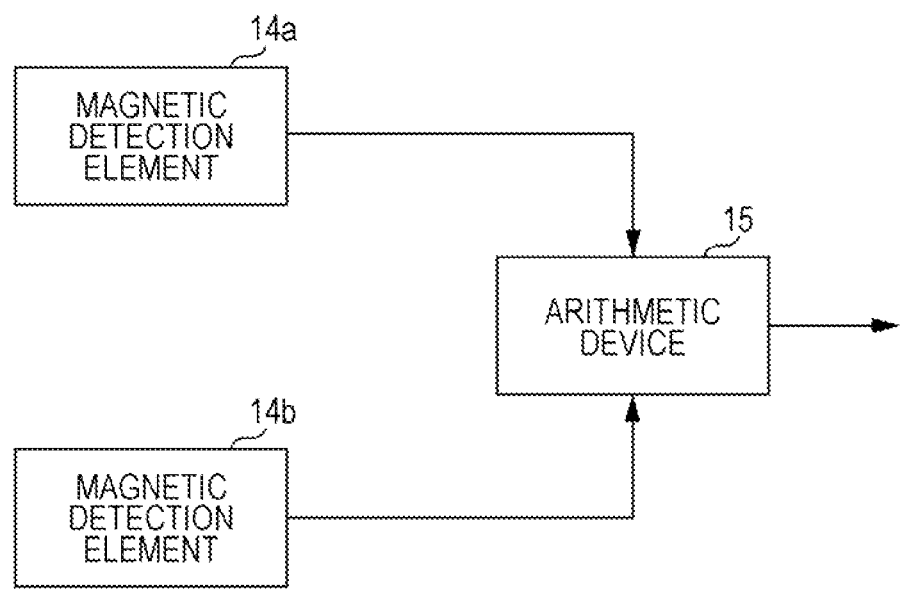
FIG. 5 is a block diagram according to a circuit configuration of a current sensor according to an embodiment.

FIG. 5 is a block diagram according to the circuit configuration of the current sensor 1. As illustrated in FIG. 5, the current sensor 1 includes an arithmetic device 15 connected to the output terminals of the magnetic detection elements 14a and 14b. The arithmetic device 15 has a function for performing an arithmetic operation (differential processing) on a current value on the basis of the output of the magnetic detection element 14a and the output of the magnetic detection element 14b. When a current has been conducted through the current path 11, the induction magnetic field A has occurred around the current path 11, and output signals corresponding to the induction magnetic field A have been output from the magnetic detection elements 14a and 14b, the arithmetic device 15 having received the output signals performs an arithmetic processing on the corresponding two output signals. In addition, when the sensitivity axis directions 141a and 141b of the magnetic detection elements 14a and 14b are equal, the arithmetic device 15 performs addition on the two output signals, and when the sensitivity axis directions 141a and 141b of the magnetic detection elements 14a and 14b are opposite, the arithmetic device 15 performs subtraction on the two output signals. The function of the arithmetic device 15 may be realized using hardware or may also be realized using software.

Figure 6A:
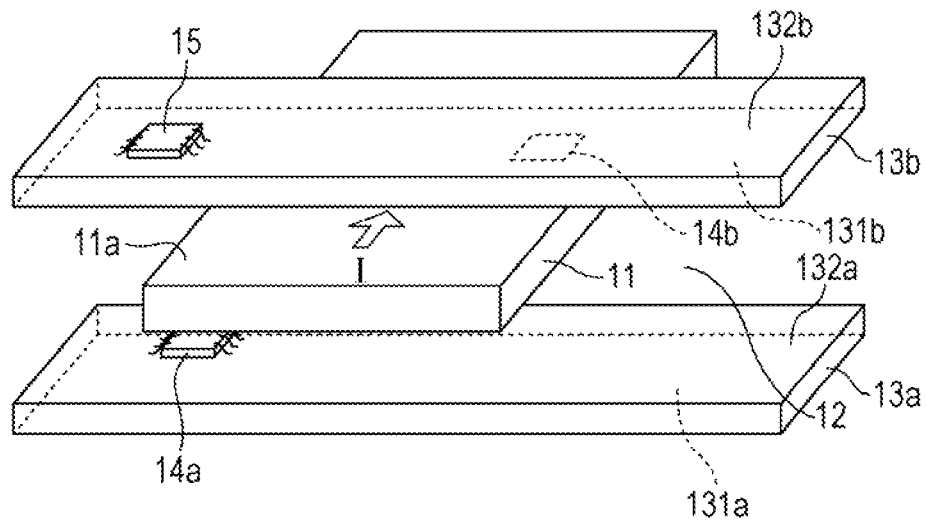
FIGS. 6A and 6B are pattern diagrams illustrating a current sensor according to an example of a modification to an embodiment.
Figure 6B:
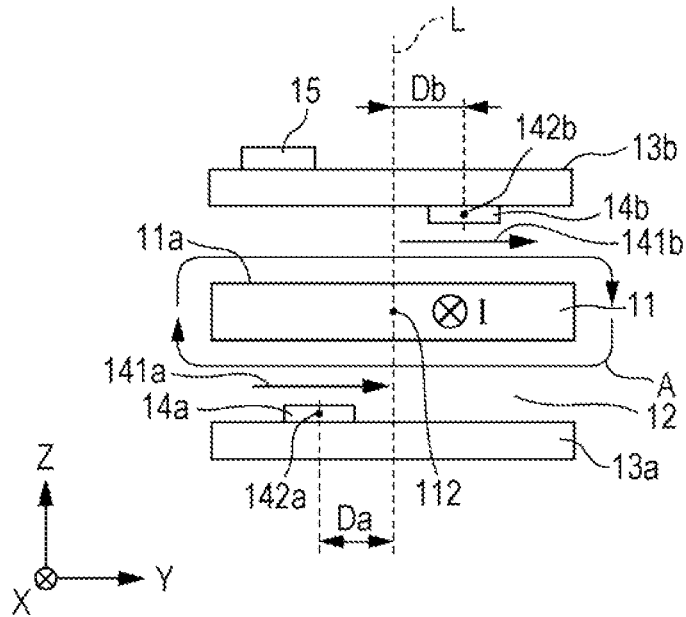

FIGS. 6A and 6B are pattern diagrams illustrating a current sensor 1 according to an example of a modification to the present embodiment. FIG. 6A is a perspective view schematically illustrating the configuration of the current sensor 1, and FIG. 6B is a view when the current sensor 1 is viewed from the near side of the plane of paper in FIG. 6A.

As illustrated in FIG. 6A, the current sensor 1 includes a current path 11 through which a current I to be measured is conducted, a pair of substrates 13a and 13b (a mounting unit) disposed so as to face each other, and two magnetic detection elements 14a and 14b disposed in the substrates 13a and 13b, respectively. In addition, in this configuration, a space between the substrates 13a and 13b disposed so as to face each other serves as a disposition region. The current sensor 1 in which the current path 11 is formed includes an arithmetic device 15 that is mounted on the substrate 13a and/or the substrate 13b and performs an arithmetic operation on the outputs of the two magnetic detection elements 14a and 14b. In the example illustrated in FIGS. 6A and 6B, a case will be described where the current path 11 has a flat-plate shape (a cross-sectional rectangle) and a space (disposition region) between the substrates 13a and 13b is included, this current path 11 being allocatable in the space.

The substrates 13a and 13b are disposed so that the main surfaces thereof are placed in the horizontal direction in FIG. 6A (a Y direction in FIG. 6B: the directions of the sensitivity axis directions 141a and 141b of the after-mentioned magnetic detection elements 14a and 14b). In this disposition region 12, the flat-plate shaped current path 11 is disposed. At this time, the main surfaces 131a, 132a, 131b, and 132b of the substrates 13a and 13b and the main surface 11a of the current path become parallel to each other. In other words, in the disposition region 12 formed by the two substrates 13a and 13b, the current path 11 is disposed so that the main surfaces 132a and 131b of the substrates 13a and 13b and the main surface 11a of the current path 11 become parallel to each other.

The current path 11 extends in a predetermined direction (a direction headed from the near side of the plane of paper to the depth in FIG. 6A), and is disposed so as to be sandwiched between the substrates 13a and 13b in the disposition region 12. While, in FIGS. 6A and 6B, the current path 11 has a flat-plate shape, the current path 11 may also adopt any form if the configuration thereof is capable of conducting therethrough the current I to be measured. For example, as the current path 11, a thin-film shaped conductive member (conductive pattern), a cross-section circular conductive member, or the like may be adopted.

In the configuration in FIGS. 6A and 6B, the flat-plate shaped current path 11 is inserted into the disposition region 12 formed by the substrates 13a and 13b so that the main surface 11a thereof becomes parallel to the main surfaces of the substrates 13a and 13b. In FIG. 6B, while clearances between the current path 11 and the substrates 13a and 13b in the up-and-down direction of the plane of paper are made wide, actually the clearances are significantly small. Accordingly, as understood from FIG. 6B, in this configuration, the current path 11 is capable of greatly moving in the Y direction. In other words, as for the current path 11, a movable region in the horizontal direction of the plane of paper is wider than a movable region in the up-and-down direction of the plane of paper. This configuration is a configuration where the position displacement of the current path 11 easily occurs in the horizontal direction of the plane of paper, compared with in the up-and-down direction of the plane of paper. In other words, this configuration turns out to have a direction in which it is easy for the position displacement of the current path 11 to relatively occur with respect to the substrates (a mounting unit) 13a and 13b mounting therein the magnetic detection elements 14a and 14b.

In addition, in the current sensor 1 illustrated in FIG. 6A, the magnetic detection elements 14a and 14b are disposed in the main surfaces 132a and 131b in the substrates 13a and 13b, respectively, the main surfaces 132a and 131b facing the current path 11. In addition, each of the magnetic detection elements 14a and 14b has a sensitivity axis parallel to directions along the main surfaces of the substrates 13a and 13b (the direction of a current conducted through the current path (an X direction in FIG. 6B) and a direction perpendicular to the direction of the virtual line L (the Y direction in FIG. 6B)). In addition, while not illustrated, the magnetic detection elements 14a and 14b may also be disposed in the main surfaces 131a and 132b on the opposite sides of the main surfaces 132a and 131b, respectively.

As illustrated in FIG. 6B, in order to obtain outputs whose phases are approximately opposite to each other owing to the induction magnetic field A from the current I to be measured conducted through the current path 11, the magnetic detection elements 14a and 14b are disposed on the main surfaces 132a and 131b of the pair of substrates 13a and 13b so as to sandwich therebetween the disposition region 12. In addition, the magnetic detection elements 14a and 14b are disposed so that the centers 142a and 142b of the magnetic detection elements 14a and 14b are located on sides opposite to each other with respect to the virtual line L passing through the gravity center 112 of the current path 11 in cross-sectional view of the current path 11.

In addition, as illustrated in FIG. 6B, the magnetic detection elements 14a and 14b may also be disposed so that the entire portions thereof deviate from the virtual line L (in FIG. 6B, the right end portion of the magnetic detection element 14a is located on the left side of the virtual line L, and the left end portion of the magnetic detection element 14b is located on the right side of the virtual line L), and as described later, the magnetic detection elements 14a and 14b may also be disposed so that a portion thereof overlaps with the virtual line L. In addition, the magnetic detection elements 14a and 14b may also be disposed so that a distance Da between a center 142a and the virtual line L and a distance Db between a center 142b and the virtual line L become equal to each other. In addition, the distance Da and the distance Db may not be identical to each other.

In the current sensor 1 illustrated in FIG. 6B, the magnetic detection elements 14a and 14b are disposed on sides opposite to each other with respect to the virtual line L. Therefore, when the disposition position of the current path 11 in the disposition region 12 is displaced in the direction P (the Y direction in FIG. 6B) parallel to the sensitivity axis directions 141a and 141b, the pluses and minuses of the output errors of the magnetic detection elements 14a and 14b are also reversed. In addition, since the magnetic detection elements 14a and 14b are disposed so as to sandwich therebetween the disposition region 12 in the substrate 13, when the disposition position of the current path 11 is displaced in the direction V (a Z direction in FIG. 6B) perpendicular to the sensitivity axis directions 141a and 141b, the pluses and minuses of the output errors of the magnetic detection elements 14a and 14b are also reversed as described in FIG. 2A. Accordingly, according to the above-mentioned dispositions of the magnetic detection elements 14a and 14b, when the disposition position of the current path 11 is displaced in any direction perpendicular or parallel to the sensitivity axis directions 141a and 141b, it may also be possible to cancel out each other's output errors by performing arithmetic processing on the outputs of the magnetic detection elements 14a and 14b, and it may also be possible to suppress a decrease in current measurement accuracy.

Embodiment

Figure 7:
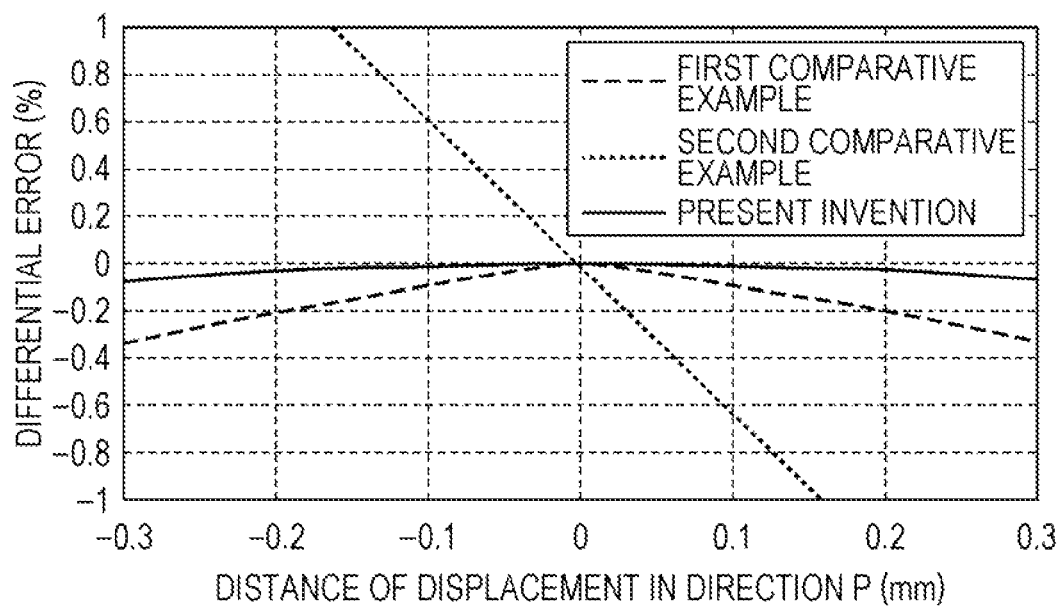
FIG. 7 is a graph illustrating an evaluation result of a current sensor according to an embodiment.
Figure 8:
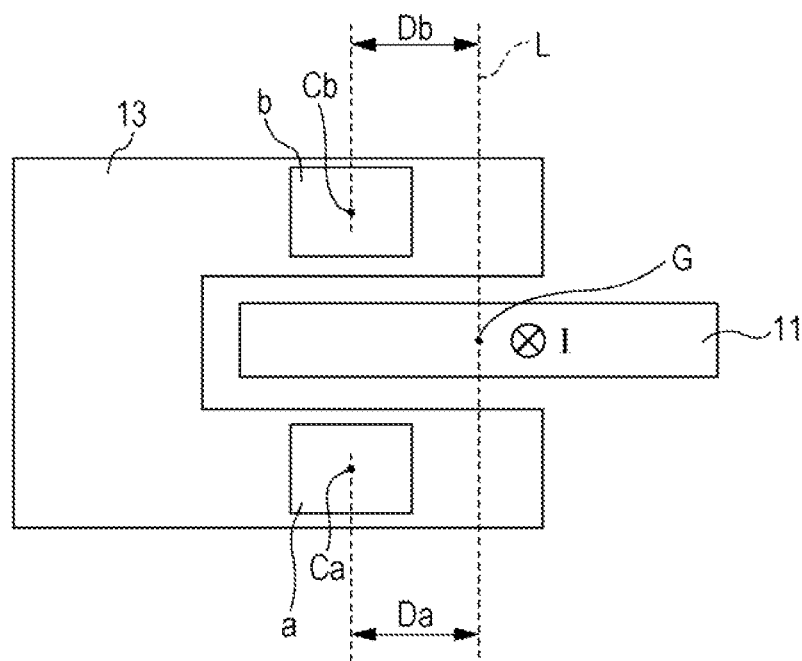
FIG. 8 is a pattern diagram illustrating a current sensor according to a comparative example.

Hereinafter, an embodiment will be described that was implemented so as to clarify the advantages of the current sensor 1. FIG. 7 is a graph illustrating an evaluation result of a current sensor according to the present invention. FIG. 8 is the pattern diagram of a current sensor according to a second comparative example. In addition, in FIG. 7, a current sensor according to a first comparative example is a current sensor in which the magnetic detection elements a and b are disposed so that the centers Ca and Cb of the magnetic detection elements a and b are located on the virtual line L, as illustrated in FIGS. 1A to 1C. In addition, the current sensor according to the second comparative example is a current sensor in which the magnetic detection elements a and b are disposed so that the centers Ca and Cb of the magnetic detection elements a and b are located on the same side with respect to the virtual line L, as illustrated in FIG. 8. The current sensor according to the embodiment is a current sensor in which the magnetic detection elements a and b are disposed so that the centers 142a and 142b of the magnetic detection elements a and b are located on sides opposite to each other with respect to the virtual line L, as described in FIGS. 3A and 3B.

In addition, in FIG. 7, a horizontal axis indicates a distance by which the disposition position of the current path 11 is displaced from a desired position in the direction P in the disposition region 12. In addition, a vertical axis indicates, as a sensitivity error, the differential error of the pair of the magnetic detection elements 14a and 14b according to the embodiment or the pair of magnetic detection elements a and b according to the first or second comparative example. For example, in FIG. 2B, a displacement toward the outside of the disposition region 12 (to the magnetic detection element 14b side in FIG. 6B) is expressed by a positive value, and a displacement toward the inside of the disposition region 12 (to the magnetic detection element 14a side in FIG. 6B) is expressed by a negative value.

In the current sensor according to the first comparative example, as described in FIG. 1C, when the disposition position of the current path 11 is displaced in the direction P, both of the distances Da and Db between the virtual line L and the centers Ca and Cb of the magnetic detection elements a and b, respectively, become larger than the case illustrated in FIG. 1A ("0" in FIG. 1A). As a result, both of the outputs of the magnetic detection elements a and b are reduced compared with the case illustrated in FIG. 1A, and negative output errors turn out to occur. Therefore, even if a difference between the outputs of the magnetic detection elements a and b is taken, it may be difficult to suppress a decrease in the differential error of the magnetic detection elements a and b, as illustrated in FIG. 7.

In addition, in the current sensor according to the second comparative example, when, in FIG. 8, the disposition position of the current path 11 is displaced toward the outside of the disposition region 12 in the direction P (in other words, in a positive direction), the distances Da and Db between the virtual line L and the centers Ca and Cb of the magnetic detection elements a and b, respectively, become larger than the case illustrated in FIG. 8. Therefore, negative output errors turn out to occur in both of the magnetic detection elements a and b, and when a difference between the outputs of the magnetic detection elements a and b is taken, the differential error of the magnetic detection elements a and b turns out to be doubled in a negative direction as illustrated in FIG. 7. On the other hand, when, in FIG. 8, the disposition position of the current path 11 is displaced toward the inside of the disposition region in the direction P (in other words, in a negative direction), the distances Da and Db between the virtual line L and the centers Ca and Cb of the magnetic detection elements a and b, respectively, become smaller than the case illustrated in FIG. 8. Therefore, positive output errors turn out to occur in both of the magnetic detection elements a and b, and when a difference between the outputs of the magnetic detection elements a and b is taken, the differential error of the magnetic detection elements a and b turns out to be doubled in a positive direction as illustrated in FIG. 7. In this way, in the current sensor according to the second comparative example, when the disposition position of the current path 11 is displaced in the direction P, the pluses and minuses of the output errors of the pair of magnetic detection elements a and b become equal. Therefore, it is difficult to suppress a decrease in current measurement accuracy.

On the other hand, in the current sensor 1 according to the present invention, as described in FIG. 4, when the disposition position of the current path 11 is displaced toward the outside of the disposition region 12 (in other words, in a positive direction), the distance Da' between the virtual line L and the magnetic detection element a becomes larger than the distance Da illustrated in FIG. 3B, and the distance Db' between the virtual line L and the magnetic detection element b becomes smaller than the distance Db illustrated in FIG. 3B. Therefore, a negative output error turns out to occur in the magnetic detection element a, and a positive output error turns out to occur in the magnetic detection element b. As a result, by taking a difference between the outputs of the magnetic detection elements a and b, it may be possible to suppress the differential error of the magnetic detection elements a and b as illustrated in FIG. 7. In the same way, when the disposition position of the current path 11 is displaced toward the inside of the disposition region 12 (in other words, in a negative direction), the distance Da' between the virtual line L and the magnetic detection element a becomes smaller than the distance Da illustrated in FIG. 3B, and the distance Db' between the virtual line L and the magnetic detection element b becomes larger than the distance Db illustrated in FIG. 3B. Therefore, a positive output error turns out to occur in the magnetic detection element a, and a negative output error turns out to occur in the magnetic detection element b. As a result, by taking a difference between the outputs of the magnetic detection elements a and b, it may be possible to suppress the differential error of the magnetic detection elements a and b as illustrated in FIG. 7. As described above, in the current sensor 1 according to the present invention, when the disposition position of the current path 11 is displaced in the direction P, the pluses and minuses of the output errors of the pair of magnetic detection elements a and b are reversed. Therefore, it may be possible to suppress a decrease in current measurement accuracy.

In addition, the present invention is not limited to the above-mentioned embodiments, and may be variously modified and implemented. While, in the above-mentioned embodiments, a case has been described where the mounting unit is a substrate in which a concave portion is provided as the disposition region of the current path, or the pair of substrates, the present invention is not limited to this, and in the same way, the present invention may also be applied to a configuration including a disposition region in which a current path is disposed and having a direction in which it is easy for the position displacement of a current path to relatively occur in this disposition region. In addition, the disposition of each configuration element in the above-mentioned embodiments, the size thereof, and so forth may be arbitrarily changed and implemented. In addition to this, the present invention may be arbitrarily modified and implemented without departing from the scope of the present invention.

The current sensor of the present invention may be used for, for example, detecting the magnitude of a current for driving a motor in an electric vehicle or a hybrid vehicle.

What is claimed is:

1. A current sensor comprising:
   a mounting unit including a disposition region in which a current path is disposed, a current flowing through the current path in a first direction defining X-direction, the current path having a flat-plate shape having a width in Y-direction perpendicular to the X-direction;
   an only pair of magnetic detection elements consisting of a first magnetic detection element and a second magnetic detection element disposed on the mounting unit such that the disposition region is interposed therebetween; and
   an arithmetic circuit provided on the mounting unit, the arithmetic circuit being configured to perform an arithmetic operation on a value of the current flowing through the current path on the basis of detection values of the pair of magnetic detection elements,
   wherein the first and second magnetic detection elements are arranged on opposite sides of a virtual line passing through a gravity center of the current path, the virtual line extending in Z-direction perpendicular to the X-direction and the Y-direction, each of the first and second magnetic detection elements has a respective sensitivity axis parallel to the Y-direction.

2. The current sensor according to claim 1, wherein the first magnetic detection element is entirely located on one side of the virtual line, while the second magnetic detection element is entirely located on the other side of the virtual line.

3. The current sensor according to claim 1, wherein each of the pair of magnetic detection elements has a same distance from a center thereof to the virtual line.

4. The current sensor according to claim 1, wherein the disposition region is formed as a concave portion having an opening, the concave portion extending in a direction of the sensitivity axes, and the current path is inserted into the concave portion from the opening along a main surface of the current path.

5. The current sensor according to claim 1, wherein the mounting unit includes a pair of substrates disposed parallel to each other, the disposition region being formed between the pair of substrates, and the current path is a conductor disposed in the disposition region so that a main surface of the current path and main surfaces of the pair of substrates are parallel to each other.

* * * * *